(12) United States Patent
Baca et al.

(10) Patent No.: US 9,176,202 B2
(45) Date of Patent: Nov. 3, 2015

(54) ELECTRONIC MODULE ASSEMBLY FOR INFLATABLE PERSONAL RESTRAINT SYSTEMS AND ASSOCIATED METHODS

(75) Inventors: Andre Baca, Laveen, AZ (US); Ronald A. Shields, Mesa, AZ (US); Willard F. Hagan, Phoenix, AZ (US)

(73) Assignee: AmSafe, Inc., Phoenix, AZ (US)

( * ) Notice: Subject to any disclaimer, the term of this patent is extended or adjusted under 35 U.S.C. 154(b) by 503 days.

(21) Appl. No.: 13/608,959

(22) Filed: Sep. 10, 2012

(65) Prior Publication Data

US 2013/0187646 A1 Jul. 25, 2013

Related U.S. Application Data

(63) Continuation-in-part of application No. 13/228,333, filed on Sep. 8, 2011, now Pat. No. 8,818,759, which is a continuation-in-part of application No. 13/174,659, filed on Jun. 30, 2011.

(60) Provisional application No. 61/533,105, filed on Sep. 9, 2011, provisional application No. 61/516,681, filed on Apr. 5, 2011.

(51) Int. Cl.
*G01R 33/00* (2006.01)
*G05B 23/02* (2006.01)
(Continued)

(52) U.S. Cl.
CPC .......... *G01R 33/0047* (2013.01); *B64D 11/062* (2014.12); *B64D 11/06205* (2014.12); *G05B 23/0256* (2013.01); *B64D 2201/00* (2013.01); *G05B 9/02* (2013.01); *Y02T 50/46* (2013.01)

(58) Field of Classification Search
CPC ...................................................... B60R 21/01
USPC .......................................... 702/182; 280/735
See application file for complete search history.

(56) References Cited

U.S. PATENT DOCUMENTS 3,766,612 A 10/1973 Hattori
3,777,255 A 12/1973 Young et al.
(Continued)

FOREIGN PATENT DOCUMENTS

CN 2380446 5/2000
CN 1446155 1/2003
(Continued)

OTHER PUBLICATIONS

European Search Report and Search Opinion dated Oct. 22, 2012 European Application No. 12161935.7; (5 pages).
(Continued)

*Primary Examiner* — John Breene
*Assistant Examiner* — Raymond Nimox
(74) *Attorney, Agent, or Firm* — Perkins Coie LLP

(57) ABSTRACT

Electronics module assemblies ("EMAs") for inflatable personal restraints and associated systems are described herein. An EMA configured in accordance with an embodiment of the present technology can include, for example, a housing having a body portion, cover portion that attaches to the body portion to form an enclosure, and protrusion extending outwardly from the cover portion. The protrusion can have an outer boundary at which the protrusion projects away from the cover portion. The EMA can further include a crash sensor within the enclosure in an area defined by the outer boundary of the protrusion. The protrusion can form an envelope of space around the crash sensor that defines a minimum distance an external object with a magnetic field can come to the crash sensor without activating it. The EMA can optionally include a magnetic field configured to disable the crash sensor upon the detection of an external magnetic field.

21 Claims, 6 Drawing Sheets

(51) Int. Cl.
*B64D 11/06* (2006.01)
*G05B 9/02* (2006.01)

(56) References Cited

U.S. PATENT DOCUMENTS

| | | | |
|---|---|---|---|
| 5,581,060 | A | 12/1996 | Kobayashi et al. |
| 5,879,024 | A | 3/1999 | Estep |
| 5,984,350 | A | 11/1999 | Hagan et al. |
| 6,002,325 | A | 12/1999 | Conaway |
| 6,239,695 | B1 | 5/2001 | Okada et al. |
| 6,449,545 | B1 | 9/2002 | Nitschke et al. |
| 6,682,094 | B1 | 1/2004 | Laituri et al. |
| 6,837,516 | B2 | 1/2005 | Miyata et al. |
| 7,224,270 | B2 | 5/2007 | Patterson et al. |
| 7,296,825 | B1 | 11/2007 | Zia et al. |
| 8,818,759 | B2 | 8/2014 | Shields et al. |
| 8,914,188 | B2 | 12/2014 | Settles et al. |
| 2002/0050826 | A1 | 5/2002 | Boran et al. |
| 2003/0030522 | A1 | 2/2003 | Kasashima et al. |
| 2003/0155753 | A1 | 8/2003 | Breed |
| 2004/0130442 | A1 | 7/2004 | Breed et al. |
| 2006/0157968 | A1 | 7/2006 | Kitazawa |
| 2006/0163430 | A1 | 7/2006 | Cordina et al. |
| 2007/0005202 | A1 | 1/2007 | Breed |
| 2007/0055429 | A1 | 3/2007 | Komaki et al. |
| 2007/0096447 | A1 | 5/2007 | Tabe |
| 2007/0156311 | A1 | 7/2007 | Elcock et al. |
| 2007/0232164 | A1 | 10/2007 | Swan et al. |
| 2010/0177538 | A1 | 7/2010 | Scherr |
| 2011/0004832 | A1 | 1/2011 | Canal et al. |
| 2012/0256403 | A1 | 10/2012 | Shields |
| 2012/0259484 | A1 | 10/2012 | Shields et al. |
| 2012/0259503 | A1 | 10/2012 | Settles |
| 2012/0259586 | A1 | 10/2012 | Shields et al. |
| 2012/0326422 | A1 | 12/2012 | Baca |
| 2013/0197746 | A1 | 8/2013 | Glueck et al. |

FOREIGN PATENT DOCUMENTS

| | | |
|---|---|---|
| CN | 1541871 | 11/2004 |
| GB | 2273568 | 6/1994 |
| JP | 2008100576 | 12/2011 |
| TW | I30323 | 11/2008 |
| TW | I33714 | 2/2011 |
| WO | WO-0129632 | 4/2001 |
| WO | WO-2007078968 | 7/2007 |

OTHER PUBLICATIONS

European Search Report and Search Opinion dated Dec. 6, 2012; European Application No. 12160025.8; (6 pages).

European Search Report and Search Opinion dated Aug. 31, 2012; European Application No. 12160240.3; (8 pages).

Non-Final Office Action dated Nov. 16, 2012; U.S. Appl. No. 13/174,659; (10 pages).

Non-Final Office Action dated Oct. 12, 2012; U.S. Appl. No. 13/227,382 (7 pages).

Partial European Search Report dated Dec. 6, 2012; European Application No. 12159833.8; (6 pages).

Non-Final Office Action dated May 7 2014; U.S. Appl. No. 13/228,362; 11 pages.

Non-Final Office Action dated Sep. 16 2013; U.S. Appl. No. 13/228,362; 11 pages.

Final Office Action dated Aug. 1 2013; U.S. Appl. No. 13/174,659; 14 pages.

Non-Final Office Action dated Jun. 11 2014; U.S. Appl. No. 13/174,659; 8 pages.

Non-Final Office Action dated Dec. 6 2013; U.S. Appl. No. 13/228,333; 9 pages.

Non-Final Office Action dated Nov. 24 2014; U.S. Appl. No. 13/174,659; 6 pages.

ELECTRONIC MODULE ASSEMBLY FOR INFLATABLE PERSONAL RESTRAINT SYSTEMS AND ASSOCIATED METHODS

CROSS-REFERENCE TO RELATED APPLICATION(S) INCORPORATED BY REFERENCE

The present application claims priority to U.S. Provisional Patent Application No. 61/533,105, filed Sep. 9, 2011, entitled "ELECTRONICS MODULE ASSEMBLY FOR INFLATABLE PERSONAL RESTRAINT SYSTEM AND ASSOCIATED METHODS," and is a continuation-in-part of U.S. patent application Ser. No. 13/228,333, filed Sep. 8, 2011 now U.S. Pat. No. 8,818,759, and entitled "COMPUTER SYSTEM FOR REMOTE TESTING OF INFLATABLE PERSONAL RESTRAINT SYSTEMS," which is a continuation-in-part of U.S. patent application Ser. No. 13/174,659, filed Jun. 30, 2011, and entitled "INFLATABLE PERSONAL RESTRAINT SYSTEMS," which claims priority to U.S. Provisional Application No. 61/516,681, filed Apr. 5, 2011, and entitled "AIRCRAFT AIRBAGS WITH WIRELESS DIAGNOSTICS," each of which is hereby incorporated herein by reference in its entirety.

TECHNICAL FIELD

The technology disclosed herein relates generally to safety restraint systems, and more specifically to electronics module assemblies for inflatable personal restraint systems.

BACKGROUND

Various types of seat belt and airbag systems have been used to protect passengers in automobiles, aircraft and other vehicles. In automobiles, airbags typically deploy from the steering column, dashboard, side panel, and/or other fixed locations. During a rapid deceleration event (e.g., a collision), a sensor detects the event and transmits a corresponding signal to an initiation device (e.g., a pyrotechnic device) on an airbag inflator. Initiation causes the inflator to release compressed gas into the airbag via a hose, thereby rapidly inflating the airbag.

Although airbags that deploy from stationary locations (e.g., a steering column) may be effective in automobiles, they may not be as effective in other types of vehicles having other seating arrangements. Seats in commercial passenger aircraft, for example, can be configured in a variety of layouts that provide different spacing between succeeding rows and adjacent seats. Moreover, such layouts may lack the availability of stationary structures upon which to mount airbags. Additionally, seatbacks in aircraft may rotate forward and downward during a crash or similar event, and thus may be unsuitable for airbag storage. As a result, airbags have been developed that deploy from seat belts to accommodate occupants in aircraft and other vehicles. Such airbags can deploy from, for example, a lap belt and/or a shoulder belt to provide additional protection during a crash or other rapid deceleration event.

Seat belt airbag systems include an electronic activation system positioned on or proximate to the seat to initiate airbag inflation. Electronic activation systems typically include a crash sensor (e.g., Hall effect sensors) that uses a magnetic field to detect rapid decelerations, which triggers a deployment circuit to activate the inflator and deploy the airbag. Some external magnetic fields, such as those found in loudspeakers, may be strong enough to activate the crash sensor and cause inadvertent airbag deployment. A magnetic shield, typically made from an expensive and heavy Mu-metal, is therefore positioned over the crash sensor to prevent such external magnetic fields from interfering with the operation of the crash sensor.

DETAILED DESCRIPTION

The present disclosure describes electronics module assemblies ("EMAs") and EMA enclosures for use with inflatable personal restraint systems, such as airbag on aircraft. In one embodiment, for example, an EMA includes an enclosure or housing having a domed section or protrusion that forms an envelope of physical space around a crash sensor, such a magnetically sensitive crash sensor. The protrusion reduces the likelihood that an external magnetic field (e.g., from a nearby loud speaker or other transient source) will inadvertently activate the crash sensor and prevent the deployment of an inflatable personal restraint system.

Figure 1:
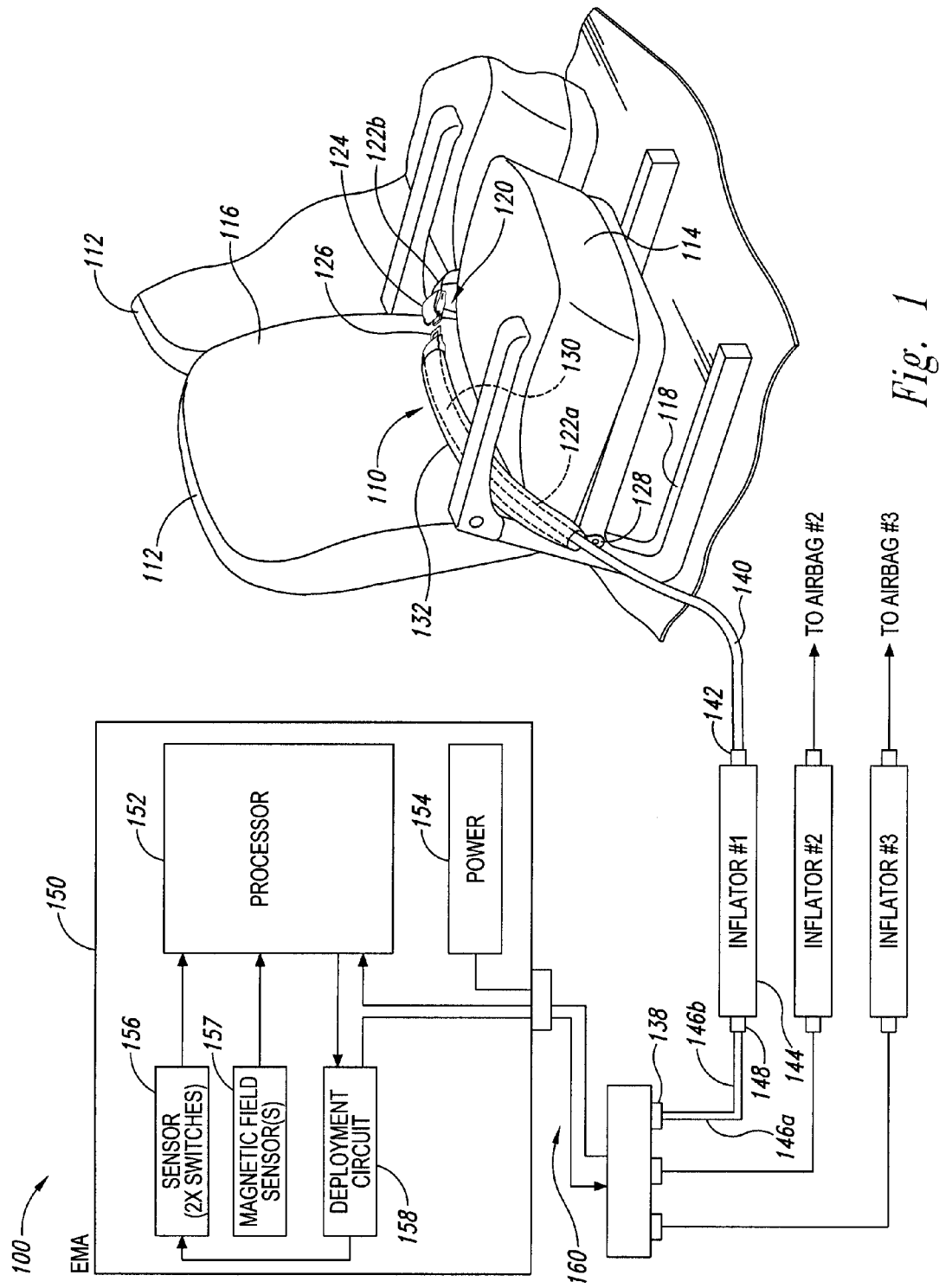
FIG. 1 is a partially schematic isometric view of an inflatable personal restraint system configured in accordance with an embodiment of the present technology.

Certain details are set forth in the following description and in FIGS. 1-2F to provide a thorough understanding of various embodiments of the disclosure. Other details describing well-known structures and systems often associated with airbags, inflators, circuitry, restraint systems, etc., have not been set forth below to avoid unnecessarily obscuring the description of the various embodiments of the disclosure. Many of the details, dimensions, angles and other features shown in FIGS. 1-2F are merely illustrative of particular embodiments of the disclosure. Accordingly, other embodiments can add other details, dimensions, angles and features without departing from the spirit or scope of the present technology. In addition, those of ordinary skill in the art will appreciate that further embodiments of the technology can be practiced without several of the details described below.

In the Figures, identical reference numbers identify identical or at least generally similar elements. To facilitate the discussion of any particular element, the most significant digit or digits of any reference number refers to the Figure in which that element is first introduced. For example, element 110 is first introduced and discussed with reference to FIG. 1.

FIG. 1 is a partially schematic isometric view of a seating area in a vehicle (e.g., an aircraft) having one or more seats 112 provided with an inflatable personal restraint system 100 ("restraint system 100") configured in accordance with an embodiment of the present technology. In one aspect of the illustrated embodiment, the seats 112 can be at least generally similar to conventional seats in, for example, a commercial aircraft. Accordingly, each seat 112 includes a back portion 116 extending upwardly from a seat portion 114, and is fixedly attached to the floor of the aircraft by a suitable seat mounting structure 118. Although certain embodiments of the present technology are described herein in the context of personal restraint systems for use in commercial aircraft, those of ordinary skill in the art will appreciate that the various structures and features of the personal restraint systems described herein can also be utilized in a wide variety of other vehicles, including other aircraft (e.g., private and military aircraft), ground vehicles (e.g., automobiles, trucks, buses, trains, motor homes), water vehicles, etc.

In another aspect of the illustrated embodiment, the restraint system 100 includes an airbag assembly 110 carried on a seat belt 120. More specifically, in the illustrated embodiment, the seat belt 120 includes a first web portion 122a and a corresponding second web portion 122b. A proximal end portion of the first web portion 122a can be fixably attached to the seat mounting structure 118 by means of a hook 128 or other suitable device known in the art. The proximal end portion of the second web portion 122b can be similarly attached to the seat mounting structure 118 on the opposite side of the seat 112. The distal end portion of the first web portion 122a carries a connector 126 having a tongue portion. The distal end portion of the second web portion 122b carries a corresponding buckle 124 configured to receive and releasably engage the tongue portion of the connector 126 to couple the two web portions 122a, 122b together around a seat occupant (not shown) in a conventional manner.

In a further aspect of the illustrated embodiment, the airbag assembly 110 includes an airbag 130 that is attached to the first web portion 122a generally proximate the connector 126. In one embodiment, for example, the airbag 130 can be fastened to the first web portion 122a using the methods and systems disclosed in U.S. patent application Ser. No. 13/086,134, which was filed Apr. 13, 2011 and is incorporated herein by reference its entirety. In FIG. 1, the airbag 130 is illustrated in the non-deployed configuration in which it is folded and stowed beneath a flexible and durable cover 132. The cover 132 encloses the airbag 130 and the first web portion 122a and extends from the connector 126 to a position adjacent to the hook 128. The cover 132 includes one or more tear seams (not shown) that are designed to rupture upon airbag inflation enabling the airbag 130 to fully inflate.

In yet another aspect of the illustrated embodiment, the airbag assembly 110 includes an inflator hose 140 having a first end portion in fluid communication with the interior of the airbag 130, and a second end portion that carries a coupling 142. The coupling 142 is configured to be operably (e.g., threadably) engaged with an outlet of an airbag inflator 144. A pair of wires 146a, 146b is operably coupled to an ignitor or bridge wire in the inflator 144, and extends from the inflator 144 to an electrical connector 138. The electrical connector 138 can operably couple the inflator 144 to an EMA 150 for controlling the deployment of the airbag 130 during a rapid deceleration event (e.g., a crash) of sufficient magnitude.

In the illustrated embodiment, the EMA 150 includes a microprocessor 152 that receives electrical power from a power source 154 (e.g., one or more lithium batteries). The EMA 150 further includes at least one crash sensor 156 that detect rapid deceleration and one or more magnetic field sensors 157 that detect the presence of an external magnetic field. Upon detection of an external magnetic field, the magnetic field sensors 157 communicate with the microprocessor 152 to deactivate the crash sensor 156 and prevent inadvertent deployment of the airbag 130. The magnetic field sensors 157 can be at least generally similar to the magnetic field sensors described in U.S. Pat. No. 6,535,115, filed Mar. 13, 2000, entitled "AIR BAG HAVING MAGNETIC FIELD PROTECTION CIRCUITRY", which is incorporated by reference herein in its entirety. As described in greater detail below, the EMA 150 can include protective housing that has additional features that prevent the EMA 150 from inadvertently deploying the airbag 130.

In operation, when the crash sensor 156 detects a crash or other rapid deceleration event above a preset magnitude, switches in the crash sensor 156 close and cause the microprocessor 152 to send a corresponding signal to a deployment circuit 158. Upon receiving a signal from the microprocessor 152, the deployment circuit 158 applies a sufficient voltage to a circuit that includes the ignitor, thereby causing the inflator 140 associated with the seat 112 to discharge its compressed gas into the airbag 130 via the hose 140. The compressed gas expands and causes the airbag 130 to inflate and provides the seat occupant (not shown) with additional protection during the crash event.

The foregoing discussion provides a high level overview of some of the structures and functions of the personal restraint system 100 in accordance with one embodiment of the present technology. Additional features of seat belt airbag systems are described in detail in U.S. Pat. No. 5,984,350, which is owned by the assignee of the present application and is incorporated herein in by reference in its entirety. Those of ordinary skill in the art will appreciate that various aspects and features of the various subsystems of the personal restraint system 100 described above can be utilized in combination with other systems without departing from the spirit or scope of the present disclosure. For example, in certain embodiments the airbag assembly 110 described above can be used with an EMA that, rather than including a microprocessor, can simply include a power source and a crash sensor that completes a circuit to activate an inflator during a crash event. Those of ordinary skill in the art will also appreciate that additional airbag assemblies 110 (e.g., a second and third airbag assembly or more) can be operably coupled to the EMA 150 for use with the other seats in the row adjacent to the seat 112. Accordingly, in one embodiment, if a row of seats in an aircraft includes three seats, each seat can be outfitted with a seat belt airbag assembly as described above, with each of the airbag assemblies coupled to an individual inflator as illustrated in FIG. 1. All three of the airbag assemblies, however, can be initiated by the single EMA 150.

Figure 2A:
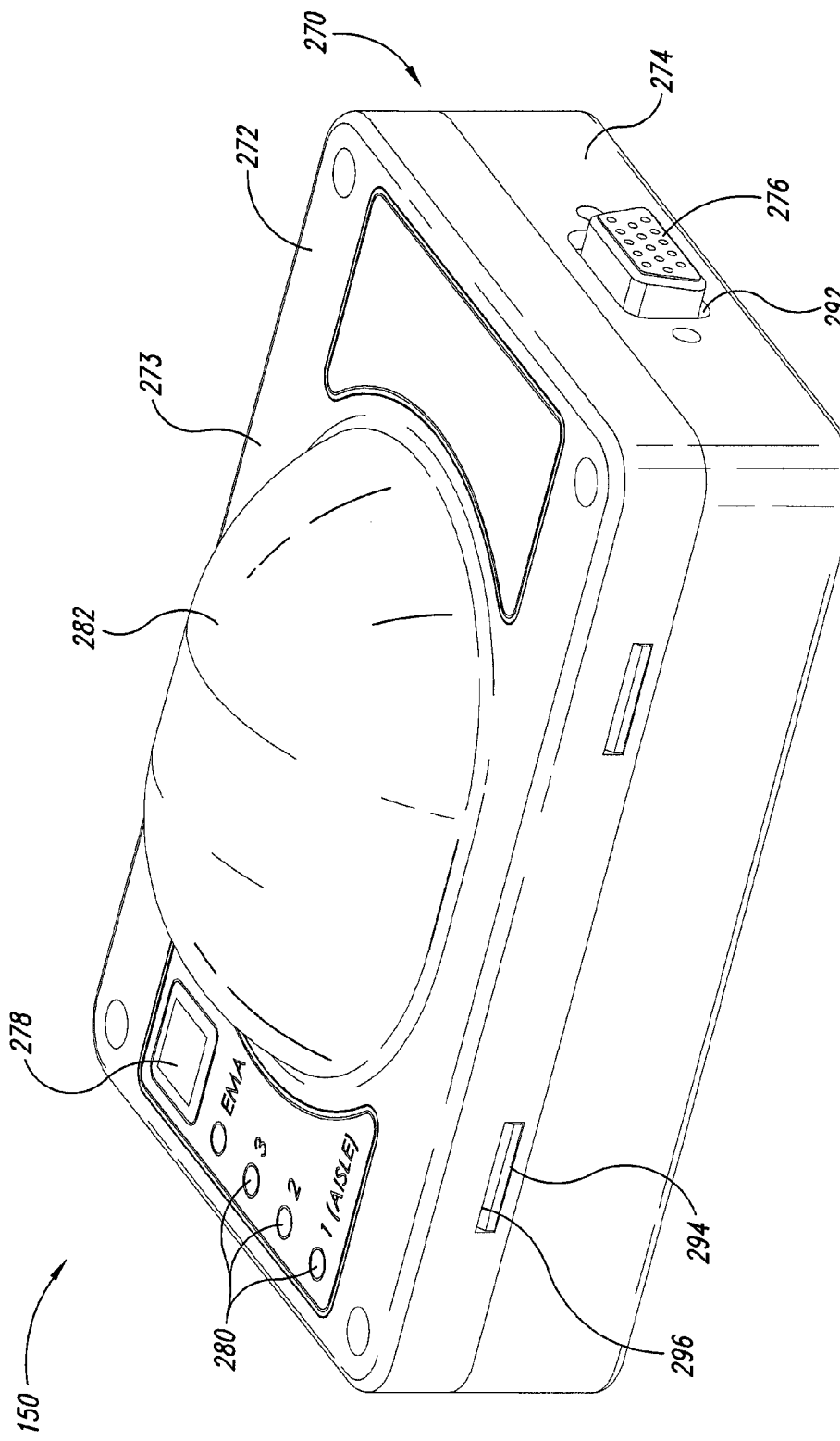
FIGS. 2A and 2B are enlarged isometric and exploded views, respectively, of an electronics module assembly ("EMA") configured in accordance with an embodiment of the present technology.
Figure 2B:
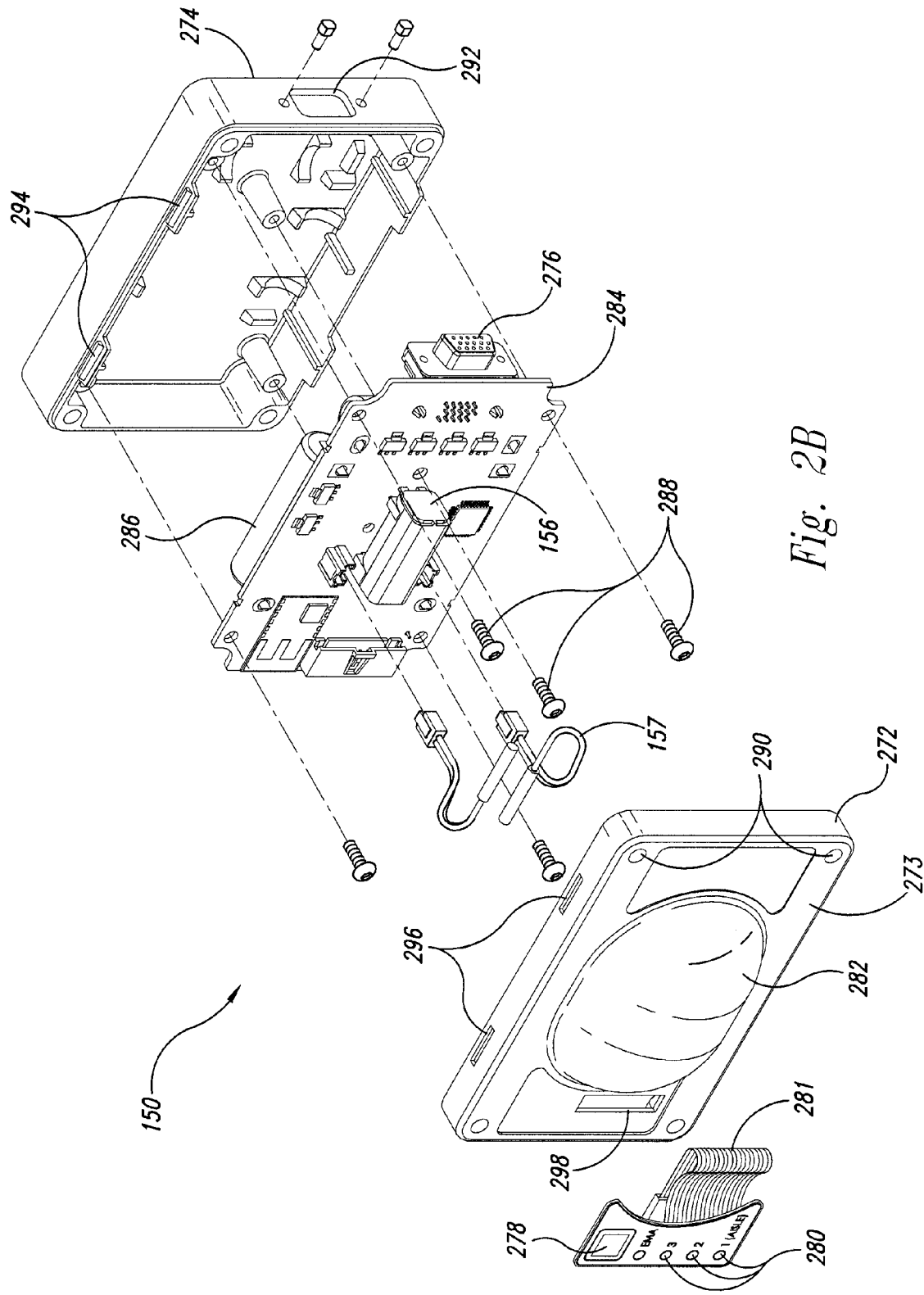

FIGS. 2A and 2B are top isometric and exploded views, respectively, of the EMA 150 configured in accordance with an embodiment of the present technology. Referring to FIGS. 2A and 2B together, the EMA 150 includes an enclosure or housing 270 having a first portion or cover portion 272 and a second portion or body portion 274 that surround various electronic components used to test and deploy one or more inflatable personal restraint systems (e.g., the restraint system 100 of FIG. 1). In various embodiments, the first portion 272 and the second portion 274 are distinct components that can be releasably coupled together to allow for access to the components stored within the housing 270. In the illustrated embodiment, for example, the second portion 274 includes a plurality of protrusions 294 that are configured to be received by openings 296 in the first portion 272 to join the two portions 272, 274 together in a clam shell arrangement. In other embodiments, the first portion 272 and the second portion 274 can be attached using other suitable releasable or permanent attachment mechanisms, such as snaps, screws, glue, welds, etc. In further embodiments, the first and second portions 272 and 274 can be integrally formed. The housing 270 can be made from a substantially rigid, lightweight material (e.g., plastic) to protect the electronic components stored therein from impact and/or debris and reduce the weight of the EMA 150.

Figure 2C:
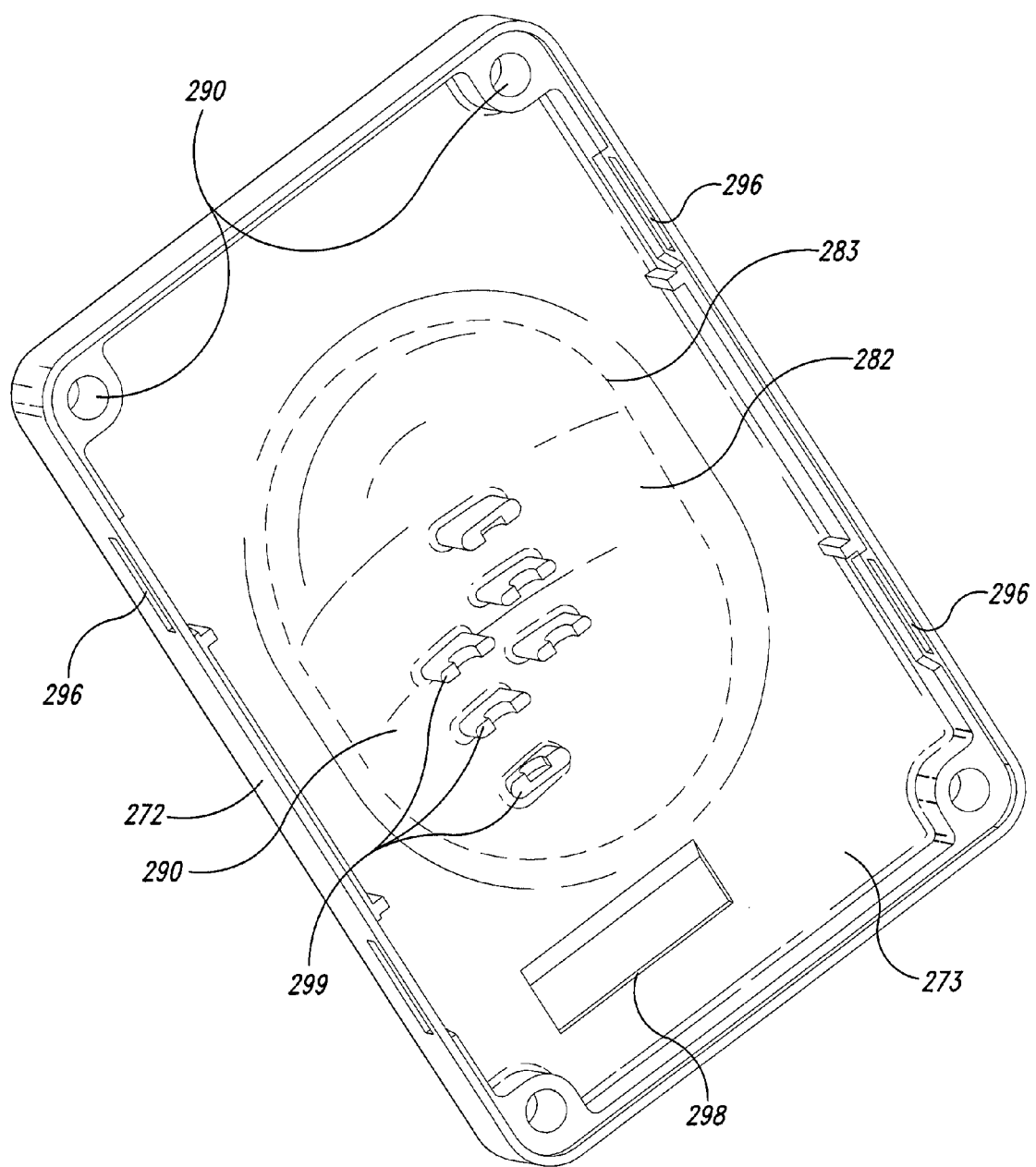
FIG. 2C is an isometric view of an underside of a cover of an EMA housing configured in accordance with an embodiment of the present technology.

In the illustrated embodiment, the housing 270 includes a raised portion or protrusion 282 that extends outwardly from a generally planar surface 273 of the first portion 272. The protrusion 282 can have virtually any shape, such as a domed shaped, rectilinear shape, irregular shape, and/or other suitable shape. As shown in FIG. 2C, the interface between the generally planar surface 273 and the protrusion 282 can define an outer boundary 283 of the protrusion 282 (e.g., the point at which the protrusion 282 projects away from the generally planar surface 273). The crash sensor 156 can be positioned in an area defined by the outer boundary 283 with the protrusion 282 oriented over the crash sensor 156 (e.g., as shown in FIG. 2B), and therefore the protrusion 282 can form an envelope of physical space or a clearance envelope around the crash sensor 156. In this manner, the protrusion 282 defines the minimum distance that can exist between an object (e.g., a magnetic object) positioned outside the housing 270 and the crash sensor 156. In various aspects of the technology, the size of the protrusion 282 can be selected based on the minimum distance that an external object with a magnetic field above a predetermined threshold can come to the crash sensor without activating it.

The crash sensor 156 can include various types of switches known in the art for responding to a rapid deceleration (or acceleration) event, including magnetically activated reed switches and/or Hall effect sensors. In one embodiment, for example, the crash sensor 156 includes two reed switches and a magnet aligned along a common axis (e.g., an axis of forward motion of the vehicle) such that a rapid deceleration event moves the magnet from a resting position to an active position over the reed switches. The magnetic field closes the reed switches and complete circuits within the EMA 150 to initiate airbag deployment. In other embodiments, the crash sensor 156 can include switches that can be at least generally similar in structure and function to the switches in U.S. patent application Ser. No. 13/170,079, filed Jun. 27, 2011, and entitled, "SENSORS FOR DETECTING RAPID DECELERATION/ACCELERATION EVENTS," which is incorporated herein by reference in its entirety. In further embodiments, the crash sensor 156 can include a Hall effect sensor that varies its output voltage in response to a change in the magnetic field to initiate airbag deployment. In still further embodiments, the EMA 150 can include more than one crash sensor 156 for redundancy to ensure that at least one crash sensor 156 operates properly in response to a rapid deceleration event.

Because the crash sensor 156 can be magnetically activated, the EMA 150 may also include one or more magnetic field sensors 157 (e.g., reed switches, Hall effect sensors, etc.) that detect the presence of an external magnetic field above a predetermined magnitude. The magnetic field sensors 157, for example, can be configured to detect external magnetic fields strong enough to interfere with the operation of the crash sensor 156 and/or other portions of the EMA 150. The magnetic field sensors 157 can be operably coupled to a deployment circuit such that when the magnetic field sensors 157 detect an external magnetic field (e.g., produced by strong magnets of the type found in loudspeakers and/or other portable electronic devices), the magnetic field sensors can switch open or closed to deactivate the deployment circuit. In various embodiments, two or more magnetic field sensor 157 can be positioned proximate one another for redundancy.

In another aspect of the illustrated embodiment, the electronics of the EMA 150 are operably coupled to a printed circuit board 284 ("PCB 284") fitted within the housing 270 using screws 288 and/or other suitable fasteners. The crash sensor 156, for example, can be mounted on the PCB 284 and magnetic field sensors 157 can be operably coupled thereto. Additionally, one or more power cells 286, such as lithium ion batteries or other suitable power sources can be positioned on the underside of the PCB 284. A connector 276 can be operably coupled to the PCB 284 and protrude through an opening 292 of the housing 270 such that the EMA 150 can communicate with other portions of an inflatable personal restraint system (e.g., the restraint system 100 of FIG. 1).

In yet another aspect of the illustrated embodiment, the EMA 150 can include a diagnostic initiation button 278 and a number of diagnostic indicators 280 operably coupled to the electronics of the EMA 150 (e.g., the crash sensor 156, the magnetic field sensors 157, the microprocessor, etc.) via connection wires 281 that extend through an opening 298 into the housing 270. The diagnostic indicators 280 can visually indicate whether the electronics associated with each personal restraint system (e.g., the inflatable personal restraint systems in positions 1, 2 and 3) are operating properly. In various embodiments, for example, the diagnostic indicators 280 can be light emitting diodes ("LEDs") and/or other suitable lighting devices that illuminate when a diagnostic test indicates that the electronics are operating properly. A diagnostic test of the EMA 150 can be initiated by pressing the diagnostic initiation button 278, wirelessly communicating with the EMA 150, connecting a diagnostic test machine to the connector 276, and/or using other suitable diagnostic test methods.

In a further aspect of the illustrated embodiment, the magnetic field sensors 157 are positioned within the protrusion 282. FIG. 2C, for example, shows support features 299 on an inner or concave surface 290 of the protrusion 282 for securing the magnetic field sensors 157 (FIG. 2B) within the protrusion 282. In other embodiments, the magnetic fields sensors 157 can be releasably or permanently secured to the inner surface 290 and/or other surfaces of the protrusion 282 using other suitable attachment mechanisms.

The size of the protrusion 282 can be selected to allow the magnetic field sensors 157 to detect an external magnetic field before it comes close enough to the crash sensor 156 to interfere with the operation of the crash sensor 156. This allows the magnetic field sensor 156 to detect an external magnetic field and disable the crash sensor 156 before it inadvertently initiates airbag deployment. Therefore, the protrusion 282 in conjunction with the magnetic field sensors 157 eliminates the need for a magnetic shield that is typically positioned over a crash sensor to shield it from external magnetic fields and prevent inadvertent airbag deployment. Such magnetic shields are typically made from a thick piece of Mu-metal, which is both expensive and heavy. Accordingly, the elimination of the magnetic shield reduces the cost, weight, and size of the EMA 150.

Figure 2D:
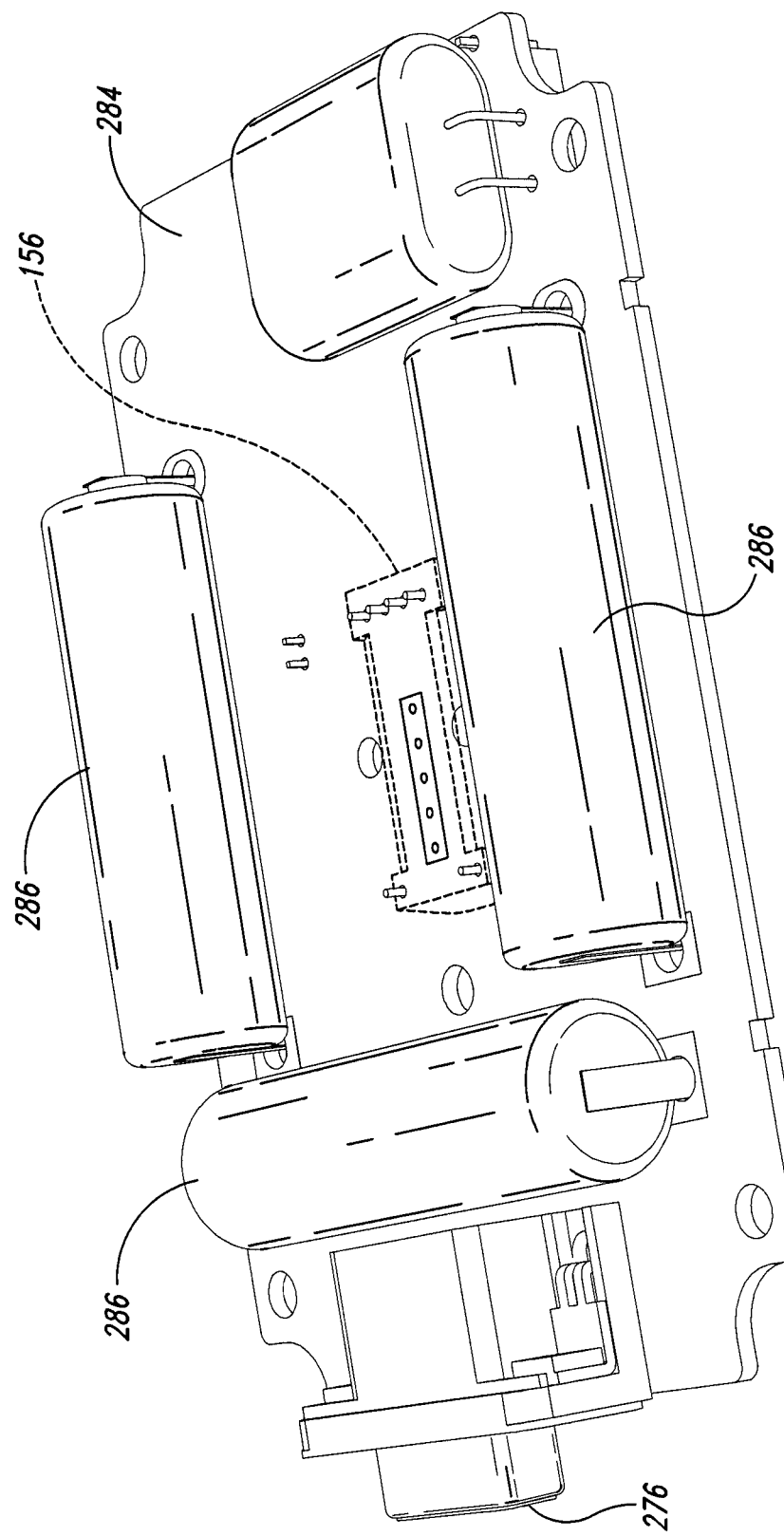
FIG. 2D is an isometric rear view of a printed circuit board for use with an EMA configured in accordance with an embodiment of the present technology.

FIG. 2D is an isometric rear view of the PCB 284 configured in accordance with an embodiment the present technology. In the illustrated embodiment, three power cells 286 positioned around the perimeter of the PCB 284 and spaced laterally apart from the crash sensor 156 (FIG. 2B), which is positioned toward the center of the PCB 284 on the opposite side of the PCB 284 (as shown by hidden lines). The power cells 286 are also not connected in parallel with the crash sensor crash sensor 156. This spacing provides an envelope of physical space around the crash sensor 156 that reduces the likelihood that any magnetic field produced by the power cells 286 will interfere with the operation of the crash sensor 156. In other embodiments, the power cells 286 can be positioned in other configurations on the PCB 284 such that they are spaced laterally apart from and not in parallel with the crash sensor 156.

Figure 2E:
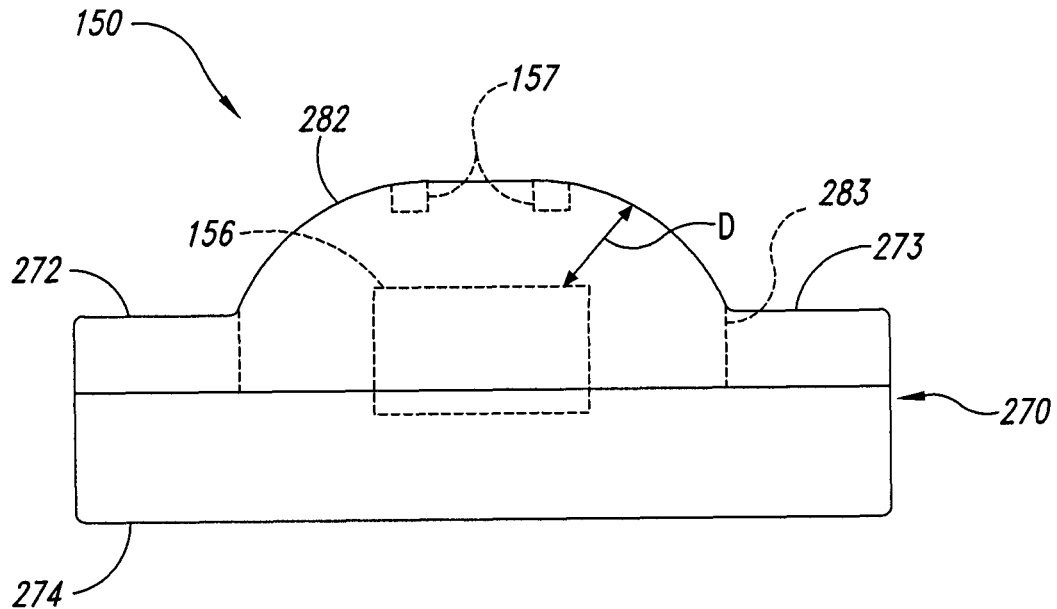
FIGS. 2E and 2F are front and side diagrams, respectively, of an EMA housing configured in accordance with an embodiment of the present technology.
Figure 2F:
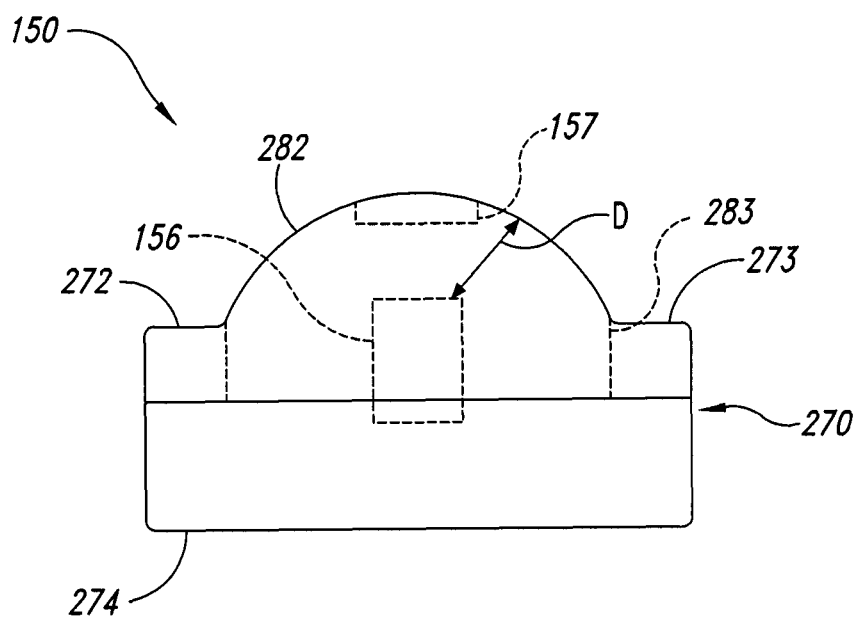

FIGS. 2E and 2F are front and side diagrams, respectively, of the housing 270 with the crash sensor 156 and the magnetic field sensors 157 shown in hidden lines. In the illustrated embodiment, the crash sensor 156 is positioned in an area defined by the outer boundary 283 of the protrusion 282 such that the protrusion 282 forms an envelope of space around the crash sensor 156. For example, the crash sensor 156 may be centered under the protrusion 282 as shown in FIGS. 2E and 2F. As discussed above, the size of the protrusion 282 can be selected to provide a minimum distance external objects with magnetic fields above a certain threshold can approach the crash sensor 156 without activating it. When the crash sensor 156 is centered with respect to the protrusion 282, the protrusion 282 can provide a generally symmetrical or uniform envelope of space around the crash sensor 156. The protrusion 282 can also be sized to allow the magnetic field sensors 157 to detect an external magnetic field before it comes close enough to the crash sensor 156 to inadvertently activate the crash sensor 156. In one embodiment, for example, the protrusion 282 can have a radius of approximately 1 inch to approximately 1.5 inch and a length of approximately 2 inches to approximately 4 inches, and the crash sensor 156 can be positioned a radial distance or minimum clearance distance D of approximately 0.25 inch to approximately 1 inch apart from the protrusion 282. In other embodiments, the minimum clearance distance between the protrusion 282 and the crash sensor 156 can be larger or smaller. In further embodiments, the protrusion 282 is not rounded, and the protrusion 282 is sized to provide a sufficient envelope of space to reduce the likelihood of inadvertent crash sensor activation by an object (e.g., a magnetic object) positioned too close to the crash sensor 156.

From the foregoing, it will be appreciated that specific embodiments have been described herein for purposes of illustration, but that modifications may be made without deviating from the spirit and scope of the various embodiments of the disclosure. Those of ordinary skill in the art, for example, will appreciate that the EMA 150 can include a number of other components and features for diagnostics, redundancy, etc., which have not been described herein to avoid unnecessarily obscuring the general description of various embodiments of the present technology. Additionally, specific elements of any of the foregoing embodiments can be combined or substituted for elements in other embodiments. Moreover, the restraint system described above can be incorporated in non-automobile or non-aircraft systems. Certain aspects of the disclosure are accordingly not limited to automobile or aircraft systems. Furthermore, while advantages associated with certain embodiments of the disclosure have been described in the context of these embodiments, other embodiments may also exhibit such advantages, and not all embodiments need necessarily exhibit such advantages to fall within the scope of the technology. Accordingly, the disclosure is not limited except as by the appended claims.

We claim:

1. An electronics control module assembly (EMA) for an inflatable personal restraint system, the EMA comprising:
   a housing having a body portion, a cover portion that attaches to the body portion to form an enclosure, and a protrusion extending outwardly from the cover portion, wherein the protrusion has an outer boundary at which the protrusion projects away from the cover portion; and
   a crash sensor positioned within the enclosure in an area defined by the outer boundary of the protrusion, wherein the protrusion forms an envelope of space around the crash sensor that defines a minimum distance that an external object with a magnetic field can come to the crash sensor without activating the crash sensor.

2. The EMA of claim 1, further comprising a magnetic field sensor positioned in the enclosure proximate the crash sensor, wherein the magnetic field sensor is operably coupled to the crash sensor and configured to disable the crash sensor upon detection of an external magnetic field above a predetermined threshold.

3. The EMA of claim 2 wherein the protrusion includes an inner concave surface having a support configured to fasten the magnetic field sensor to the inner concave surface.

4. The EMA of claim 1 wherein the crash sensor includes at least one of a reed switch and a Hall effects sensor.

5. The EMA of claim 1 wherein the protrusion has a domed shape that extends from a generally planar surface of the cover portion.

6. The EMA of claim 1 wherein the crash sensor is not protected by a magnetic shield.

7. The EMA of claim 1 wherein the envelope of space defines a generally uniform clearance envelope on one side of the crash sensor.

8. The EMA of claim 1, further comprising:
   a printed circuit board positioned in the enclosure and having a first side opposite a second side, wherein the crash sensor is positioned on the first side of the printed circuit board; and
   at least one power cell positioned on the second side of the printed circuit board, wherein the power cell is spaced laterally apart from the crash sensor.

9. The EMA of claim 1 wherein the protrusion includes an inner concave surface, and wherein the EMA further comprises:
   a magnetic field sensor operably coupled to the crash sensor and configured to disable the crash sensor upon the detection of an external magnetic field above a predetermined threshold;
   a plurality of supports configured to fasten the magnetic field sensor to the inner concave surface of the protrusion;
   a printed circuit board positioned within the housing and having a first side opposite a second side, wherein the crash sensor is positioned on the first side and the magnetic field sensor is operably coupled to the printed circuit board;
   at least one power cell positioned on the second side of the printed circuit board, wherein the power cell is spaced laterally apart from the crash sensor; and
   a deployment circuit configured to initiate deployment of an airbag when the crash sensor detects a deceleration or acceleration above a predetermined magnitude, wherein the magnetic field sensor is configured to deactivate the deployment circuit upon the detection of an external magnetic field above a predetermined threshold.

10. An electronics control module assembly (EMA) for an inflatable personal restraint system, the EMA comprising:
   a housing having a generally planar outer surface and protrusion extending outwardly from the generally planar outer surface;
   a deployment circuit configured to initiate inflation of an airbag; and
   a magnetically-activated crash sensor operably coupled to the deployment circuit and positioned within the housing, wherein the protrusion forms a clearance envelope around the crash sensor that defines a minimum distance that an external object with a magnetic field can come to the crash sensor without activating the crash sensor.

11. The EMA of claim 10 wherein the protrusion includes an inner surface facing the crash sensor, and wherein the EMA further comprises:
a magnetic field sensor supported by the inner surface of the protrusion and spaced apart from the crash sensor, wherein the magnetic field sensor is configured to disable the deployment circuit when the magnetic field sensor detects an external magnetic field that exceeds a threshold value at least large enough to trigger deployment of the airbag.

12. The EMA of claim 10 wherein the housing does not include Mu-metal.

13. The EMA of claim 10 wherein:
the housing includes a first portion releasably coupled to a second portion;
the protrusion extends from the first portion; and
the crash sensor is positioned at least partially within the second portion of the housing.

14. An inflatable personal restraint system, comprising:
a seatbelt having a deployable airbag;
an inflator operably coupled to the airbag; and
an electronics module assembly (EMA) operably coupled to the inflator and configured to initiate inflation of the airbag, the EMA having a housing and a crash sensor positioned in the housing, wherein the housing includes a generally planar surface and a protrusion extending from the generally planar surface, and wherein the crash sensor is positioned in an area defined by an outer boundary of the protrusion, the protrusion forming an envelope of physical space around the crash sensor that prevents activation of the crash sensor due to an external magnetic field.

15. The inflatable personal restraint system of claim 14 wherein the EMA further includes a magnetic field sensor supported by an inner surface of the protrusion, wherein the magnetic field sensor is configured to disable the crash sensor upon detection of an external magnetic field that exceeds a threshold value at least large enough to trigger deployment of the airbag.

16. The inflatable personal restraint system of claim 14 wherein the EMA further includes at least one power cell spaced laterally apart from and non-parallel to the crash sensor.

17. A method of manufacturing an electronics control module assembly (EMA), the method comprising:
providing a housing having a protrusion extending outwardly from a generally planar surface of the housing;
positioning a crash sensor in the housing within an area defined by an outer boundary of the protrusion, wherein the protrusion forms an envelope of physical space around the crash sensor to prevent activation of the crash sensor due to an external magnetic field; and
operably coupling the crash sensor to a deployment circuit configured to initiate inflation of an airbag.

18. The method of claim 17 wherein:
providing the housing comprises providing a first portion and a second portion of the housing, wherein the first portion includes the protrusion and the second portion is configured to releasably couple to the first portion; and
positioning the crash sensor in the housing comprises positioning the crash sensor at least partially within the second portion of the housing.

19. The method of claim 17, further comprising positioning at least one power cell within the housing, wherein the at least one power cell is spaced laterally apart from the crash sensor.

20. The method of claim 17 further comprising positioning a magnetic field sensor on an inner surface of the protrusion, wherein the magnetic field sensor is configured to deactivate the deployment circuit when the magnetic field sensor detects an external magnetic field above a threshold value that is at least large enough to trigger the crash sensor.

21. The method of claim 17 wherein providing the housing does not comprise forming a magnetic shield around the crash sensor, and wherein positioning the crash sensor in the housing comprises positioning a magnetically activated crash sensor within the housing.

* * * * *